US011152364B1

(12) United States Patent
Lin

(10) Patent No.: US 11,152,364 B1
(45) Date of Patent: Oct. 19, 2021

(54) SEMICONDUCTOR STRUCTURE AND METHODS FOR MANUFACTURING THE SAME

(71) Applicant: Vanguard International Semiconductor Corporation, Hsinchu (TW)

(72) Inventor: Shin-Cheng Lin, Tainan (TW)

(73) Assignee: Vanguard International Semiconductor Corporation, Hstnchu (TW)

( * ) Notice: Subject to any disclaimer, the term of this patent is extended or adjusted under 35 U.S.C. 154(b) by 0 days.

(21) Appl. No.: 16/854,161

(22) Filed: Apr. 21, 2020

(51) Int. Cl.
*H01L 27/095* (2006.01)
*H01L 29/417* (2006.01)
*H01L 29/47* (2006.01)
*H01L 21/02* (2006.01)
*H01L 21/8252* (2006.01)
*H01L 29/45* (2006.01)
*H01L 29/778* (2006.01)
*H01L 21/027* (2006.01)
*H01L 21/306* (2006.01)
(Continued)

(52) U.S. Cl.
CPC ........ *H01L 27/095* (2013.01); *H01L 21/0274* (2013.01); *H01L 21/02538* (2013.01); *H01L 21/30612* (2013.01); *H01L 21/67069* (2013.01); *H01L 21/8252* (2013.01); *H01L 29/26* (2013.01); *H01L 29/41775* (2013.01); *H01L 29/452* (2013.01); *H01L 29/475* (2013.01); *H01L 29/66462* (2013.01); *H01L 29/778* (2013.01)

(58) Field of Classification Search
CPC ............. H01L 27/095; H01L 21/02538; H01L 29/475; H01L 29/66462; H01L 21/30612; H01L 21/8252; H01L 29/26; H01L 21/67069; H01L 29/41775; H01L 29/778; H01L 29/452; H01L 21/0274
See application file for complete search history.

(56) References Cited

U.S. PATENT DOCUMENTS

2008/0230784 A1  9/2008  Murphy
2008/0296618 A1  12/2008  Suh et al.
(Continued)

OTHER PUBLICATIONS

Taiwanese Office Action and Search Report for Taiwanese Application No. 108146872, dated Aug. 5, 2020.

*Primary Examiner* — Mohammed R Alam
(74) *Attorney, Agent, or Firm* — Birch, Stewart, Kolasch & Birch, LLP

(57) ABSTRACT

A semiconductor structure includes a substrate having a first region and a second region, an epitaxial layer above the substrate, a first device on the first region, a second device on the second region and an isolation structure on the substrate. The first device includes a first gate electrode, a first source electrode and a first drain electrode disposed at two opposite sides of the first gate electrode. A dielectric layer disposed on the epitaxial layer covers the first gate electrode. The second device includes a second gate electrode disposed on the dielectric layer, second source and drain electrodes disposed at two opposite sides of the second gate electrode. The second source electrode is electrically connected to the first drain electrode. Also, the portions of the epitaxial layer respectively disposed in the first and second regions are isolated from each other by the isolation structure.

28 Claims, 9 Drawing Sheets

(51) Int. Cl.
*H01L 29/26* (2006.01)
*H01L 21/67* (2006.01)
*H01L 29/66* (2006.01)

(56) References Cited

U.S. PATENT DOCUMENTS

| | | |
|---|---|---|
| 2010/0019279 A1 | 1/2010 | Chen et al. |
| 2013/0146893 A1* | 6/2013 | Thei .................... H01L 21/8258 257/76 |
| 2014/0239346 A1* | 8/2014 | Green ................. H01L 29/7787 257/192 |
| 2014/0264449 A1* | 9/2014 | Parsey, Jr. ......... H01L 29/66462 257/194 |
| 2017/0033210 A1* | 2/2017 | Curatola ............. H01L 29/7786 |
| 2017/0069617 A1 | 3/2017 | Wong et al. |
| 2020/0203520 A1* | 6/2020 | Dellas ................ H01L 21/0254 |
| 2020/0251586 A1* | 8/2020 | Otake ................ H01L 29/0847 |

\* cited by examiner

SEMICONDUCTOR STRUCTURE AND METHODS FOR MANUFACTURING THE SAME

BACKGROUND

Technical Field

The disclosure relates to a semiconductor structure and methods of manufacturing the same, and it relates to a semiconductor structure suitable for high-voltage operation and methods of manufacturing the same.

Description of the Related Art

In recent years, the development of semiconductor structures for use in computers, consumer electronics, and other fields has progressed rapidly. Currently, semiconductor structure technology has been widely accepted in Metal-Oxide-Semiconductor Field-Effect Transistor (MOSFET) products that have a high market share. Semiconductor structures are used in a variety of electronic applications, such as high-power devices, personal computers, cell phones, digital cameras, and other electronic devices. These semiconductor structures are typically fabricated by depositing insulating layers or dielectric layers, conductive layer materials, and semiconductor layer materials on a semiconductor substrate, followed by patterning the various material layers by using photolithography processes. Therefore, the circuit devices and components are formed on the semiconductor substrate.

Among these semiconductor structures, high-electron mobility transistors (HEMTs) have been widely used in the field of high-power applications since they have such advantages as high output power and high breakdown voltage. Although existing semiconductor structures and methods for manufacturing the same have been adequate for their intended purposes, they have not been entirely satisfactory in all respects. Therefore, there are still some problems to be overcome in regards to semiconductor integrated circuits and technology.

Taking a system in package (SiP) as an example, a number of chips with different functions are directly packaged into one integrated circuit (IC) with desirable functions, and different chips are electrically connected such as by wire bonding before packaging. After packaging is completed, a semiconductor structure constructed as a system in package is formed. Compared with a system on chip (SoC), which is an integrated circuit that integrates all components with different functions, fabrication of a system in package (SiP) having several circuits integrated in one package is much more easier. However, electrical connection between two components (e.g. chips) by wire bonding will produce parasitic inductance and parasitic capacitance, thereby inducing more serious noise. For example, when a change rate of input current (L*di/dt) for a semiconductor structure is high, it causes short duration electrical transients in current (also known as spike of current), which further limits the operation frequency of the semiconductor structure. Furthermore, if the swing of the spike of current is too large, it may reach or exceed threshold voltages of the components (e.g. chips) and causes damage to the components (e.g. chips).

SUMMARY

Some embodiments of the present disclosure provide semiconductor structures. A semiconductor structure includes a substrate having a first region and a second region, and an epitaxial layer above the substrate. The semiconductor structure also includes a first device on the first region of the substrate, and a second device on the second region of the substrate. In some embodiments, the first device includes a first gate electrode on the epitaxial layer, a first source electrode and a first drain electrode disposed at two opposite sides of the first gate electrode, wherein a dielectric layer is disposed on the epitaxial layer and covers the first gate electrode. The second device includes a second gate electrode disposed on the dielectric layer, a second source electrode and a second drain electrode disposed at two opposite sides of the second gate electrode, wherein the second source electrode is electrically connected to the first drain electrode. The semiconductor structure further includes an isolation structure on the substrate, wherein portions of the epitaxial layer respectively disposed in the first region and the second region are isolated from each other by the isolation structure.

In some embodiments, the first gate electrode includes a p-type doping gallium nitride (GaN) material, and the second gate electrode includes metal or polysilicon.

In some embodiments, the second gate electrode of the second device is electrically connected to the first source electrode of the first device.

In some embodiments, the isolation structure penetrates through the epitaxial layer and contacts the top surface of the substrate.

In some embodiments, the semiconductor structure further includes a seed layer disposed on the substrate, wherein the epitaxial layer is disposed on the seed layer.

In some embodiments, the isolation structure penetrates through the epitaxial layer and the seed layer, and the isolation structure contacts the top surface of the substrate.

In some embodiments, the first source electrode comprises two first conducting portions electrically connected to each other, and the first device further comprises a first through hole electrically connected to one of the first conducting portions, wherein the first through hole penetrates through the epitaxial layer and contacts the seed layer.

In some embodiments, the second source electrode comprises two of the second conducting portions electrically connected to each other, and the second device further comprises a second through hole electrically connected to one of the second conducting portions, wherein the second through hole penetrates through the epitaxial layer and contacts the seed layer.

In some embodiments, the first device is a high-voltage enhancement mode transistor, and the second device is a high-voltage depletion mode transistor.

In some embodiments, the semiconductor structure further includes an interlayer dielectric layer on the epitaxial layer and covering the first device and the second device, wherein the interlayer dielectric layer comprises the dielectric layer covering the first gate electrode and another dielectric layer covering the second gate electrode.

In some embodiments, the semiconductor structure further includes a third device on the second region of the substrate. The third device includes a third gate electrode on the dielectric layer, a third source electrode and a third drain electrode disposed at two opposite sides of the third gate electrode, wherein the third source electrode of the third device is electrically connected to the second drain electrode of the second device.

In some embodiments, the third gate electrode of the third device is electrically connected to the second source electrode of the second device.

In some embodiments, the semiconductor structure further includes another isolation structure disposed on the substrate, so that other portions of the epitaxial layer corresponding to the second device and the third device are isolated from each other by the aforementioned another isolation structure.

In some embodiments, the first device is a high-voltage enhancement mode transistor, and the second device and the third device are high-voltage depletion mode transistors.

In some embodiments, the substrate includes a base and an insulating layer disposed on the base, and the epitaxial layer is disposed on the insulating layer.

Some embodiments of the present disclosure present methods for manufacturing semiconductor structures. A method includes providing a substrate, wherein the substrate has a first region and a second region. The method includes forming an epitaxial layer above the substrate, and forming an isolation structure on the substrate, wherein portions of the epitaxial layer respectively disposed in the first region and the second region are isolated from each other by the isolation structure. The method also includes forming a first device on the first region of the substrate, and forming a second device on the second region of the substrate. In some embodiments, the first device includes a first gate electrode on the epitaxial layer, a first source electrode and a first drain electrode disposed at two opposite sides of the first gate electrode, wherein a dielectric layer is disposed on the epitaxial layer and covers the first gate electrode. The second device includes a second gate electrode disposed on the dielectric layer, a second source electrode and a second drain electrode disposed at two opposite sides of the second gate electrode, wherein the second source electrode is electrically connected to the first drain electrode.

In some embodiments, the method for manufacturing a semiconductor structure further includes electrically connecting the second gate electrode of the second device to the first source electrode of the first device.

According to the method for manufacturing the semiconductor structure in some embodiments, the isolation structure penetrates through the epitaxial layer and contacts the top surface of the substrate.

In some embodiments, the method for manufacturing a semiconductor structure further includes forming a seed layer on the substrate, wherein the epitaxial layer is formed on the seed layer.

According to the method for manufacturing the semiconductor structure in some embodiments, the isolation structure penetrates through the epitaxial layer and the seed layer, and the isolation structure contacts the top surface of the substrate.

According to the method for manufacturing the semiconductor structure in some embodiments, the first source electrode comprises two of the first conducting portions electrically connected to each other, and the first device further includes a first through hole electrically connected to one of the first conducting portions, wherein the first through hole penetrates through the epitaxial layer and contacts the seed layer.

According to the method for manufacturing the semiconductor structure in some embodiments, the second source electrode comprises two of the second conducting portions electrically connected to each other, and the second device further includes a second through hole electrically connected to one of the second conducting portions, wherein the second through hole penetrates through the epitaxial layer and contacts the seed layer.

According to the method for manufacturing the semiconductor structure in some embodiments, the first device is a high-voltage enhancement mode transistor, and the second device is a high-voltage depletion mode transistor.

According to the method for manufacturing the semiconductor structure in some embodiments, the semiconductor structure further includes an interlayer dielectric layer on the epitaxial layer, the interlayer dielectric layer covers the first device and the second device, wherein the interlayer dielectric layer comprises the dielectric layer covering the first gate electrode and another dielectric layer covering the second gate electrode.

In some embodiments, the method for manufacturing the semiconductor structure further includes forming a third device on the second region of the substrate, and the third device includes a third gate electrode on the dielectric layer, a third source electrode and a third drain electrode disposed at two opposite sides of the third gate electrode, wherein the third source electrode of the third device is electrically connected to the second drain electrode of the second device.

According to the method for manufacturing the semiconductor structure in some embodiments, the third gate electrode of the third device is electrically connected to the second source electrode of the second device.

According to the method for manufacturing the semiconductor structure in some embodiments further includes forming another isolation structure on the substrate, so that other portions of the epitaxial layer corresponding to the second device and the third device are isolated from each other by the aforementioned another isolation structure.

According to the method for manufacturing the semiconductor structure in some embodiments, the first device is a high-voltage enhancement mode transistor, and the second device and the third device are high-voltage depletion mode transistors.

A detailed description is given in the following embodiments with reference to the accompanying drawings.

BRIEF DESCRIPTION OF THE DRAWINGS

The embodiments of the disclosure can be more fully understood by reading the subsequent detailed description and examples with references made to the accompanying drawings. For clarity of illustration, various elements in the drawings may not be drawn to scale, wherein.

DETAILED DESCRIPTION

Figure 1A:
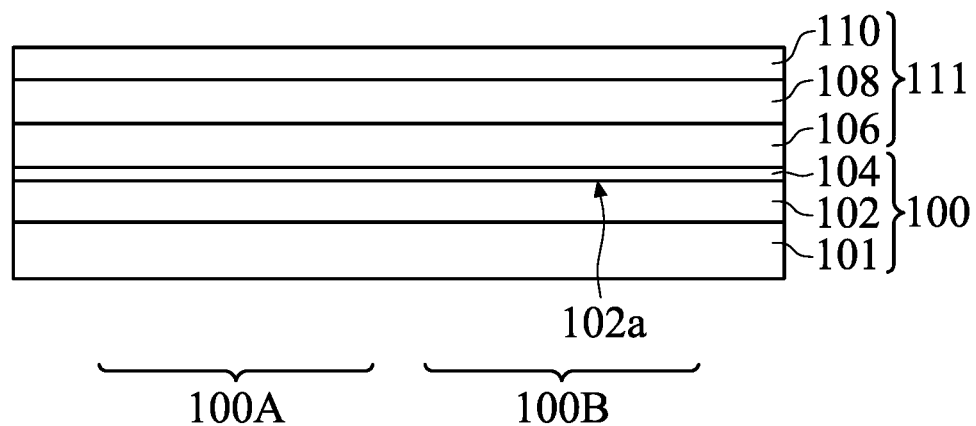
FIG. 1A-FIG. 1G illustrate cross-sectional views of intermediate steps of a method for manufacturing a semiconductor structure as shown in FIG. 1G, in accordance with some embodiments of the present disclosure.

The following description provides various embodiments, or examples, for implementing different features of the present disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numbers and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments are described below. Throughout the various views and illustrative embodiments, similar reference numbers are used to designate similar features/components. It should be understood that additional operations can be provided before, during, and after the method, and some of the operations can be replaced or eliminated for other embodiments of the method.

Embodiments provide semiconductor structures and methods for manufacturing the same. In some embodiments, the semiconductor structure includes several devices cascaded to each other and constructed on the same substrate. Also, the portions of the epitaxial layer respectively corresponding to the different devices are isolated from each other by one or more isolation structures. According to the connection way of the devices of the semiconductor structure in some embodiments, the semiconductor structure can be used in high-voltage applications or ultra-high-voltage applications without the need to form a thick epitaxial layer. The epitaxial layer with a reduced thickness not only reduces the epitaxial growth time, but also significantly reduces the weight of the epitaxial layer 111 on the substrate 100, thereby reducing the stress generated by the epitaxial layer on the substrate. Also, each device included in the semiconductor structure, in accordance with some embodiments, can be a device that merely withstands a voltage lower than an operation voltage. According to the embodiments, a high-voltage application can be implemented by cascading the devices of the semiconductor structure. In some embodiments, a semiconductor structure includes one enhancement mode (E-mode) transistor and one or more depletion mode (D-mode) transistors cascaded to each other. Additionally, the method for manufacturing the semiconductor structure in accordance with some embodiments is a method for fabricating a system on chip (SoC). According to the embodiments as provided above, the cascaded devices (such as transistors) of the semiconductor structure do not use the bonding wires for electrical connections, which can prevent the noise induced by the parasitic inductance and the parasitic capacitance (typically produced from the bonding wires) and reduce the spike of current (typically causing by a high change rate of input current (di/dt)). The electrical performance of the semiconductor structure can be further improved. Accordingly, the electrical characteristics and the product reliability of the semiconductor structures, in accordance with some embodiments, can be significantly improved.

In some of the embodiments described below, a high electron mobility transistor (HEMT) is used to illustrate a semiconductor structure. However, the present disclosure is not limited thereto. Some embodiments of the present disclosure can be applied to other types of semiconductor structures.

Figure 1B:
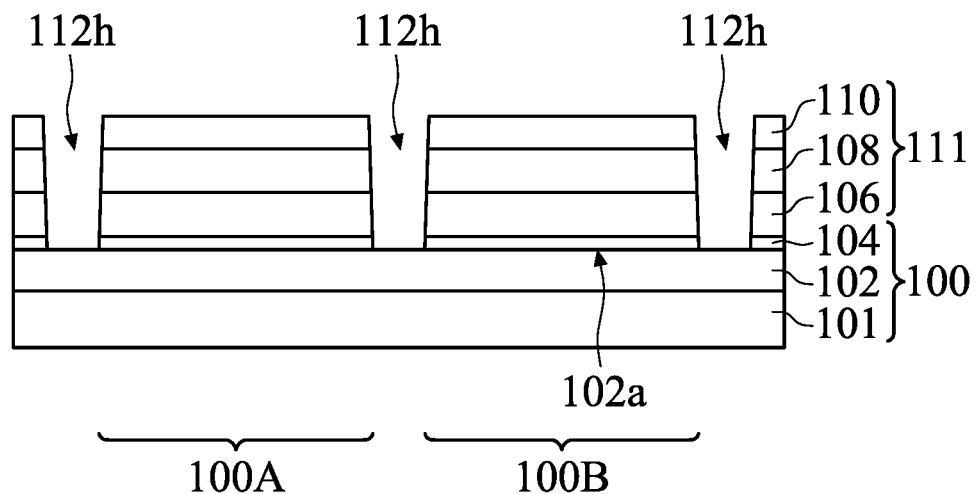
Figure 1C:
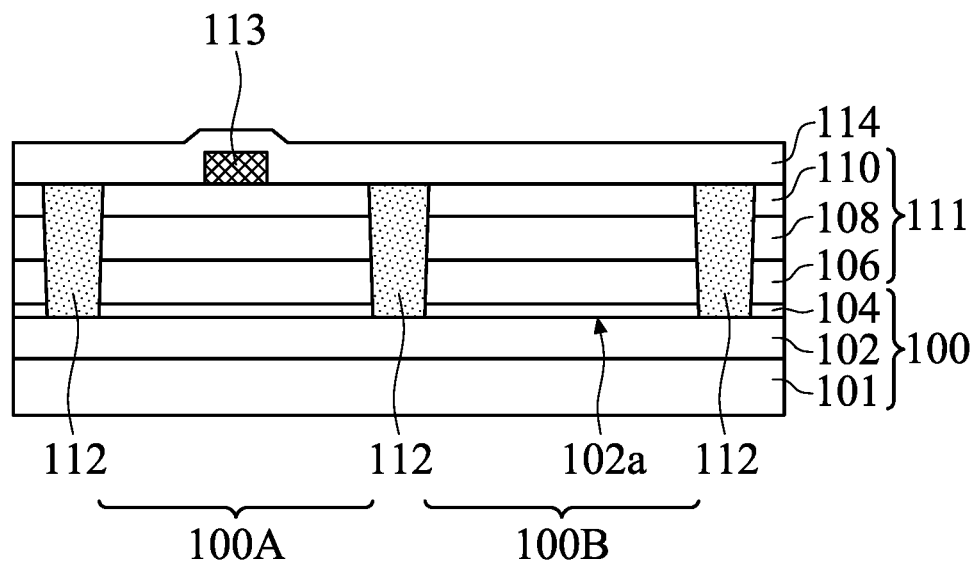
Figure 1D:
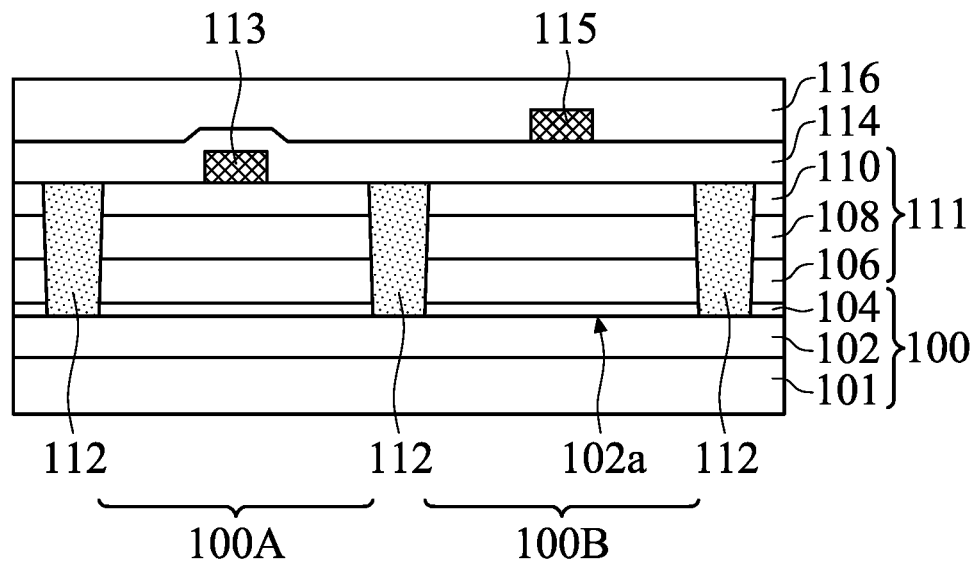
Figure 1E:
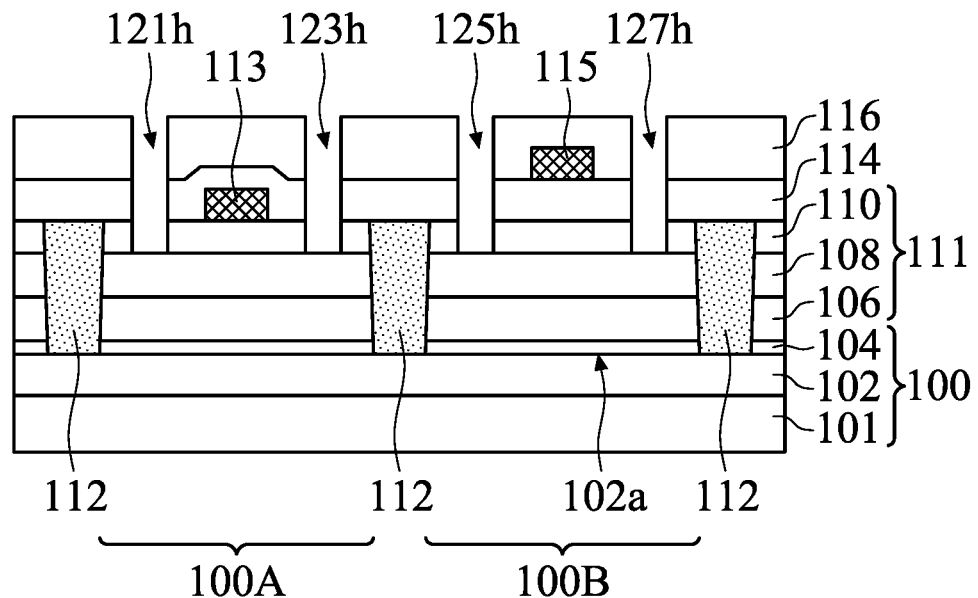
Figure 1F:
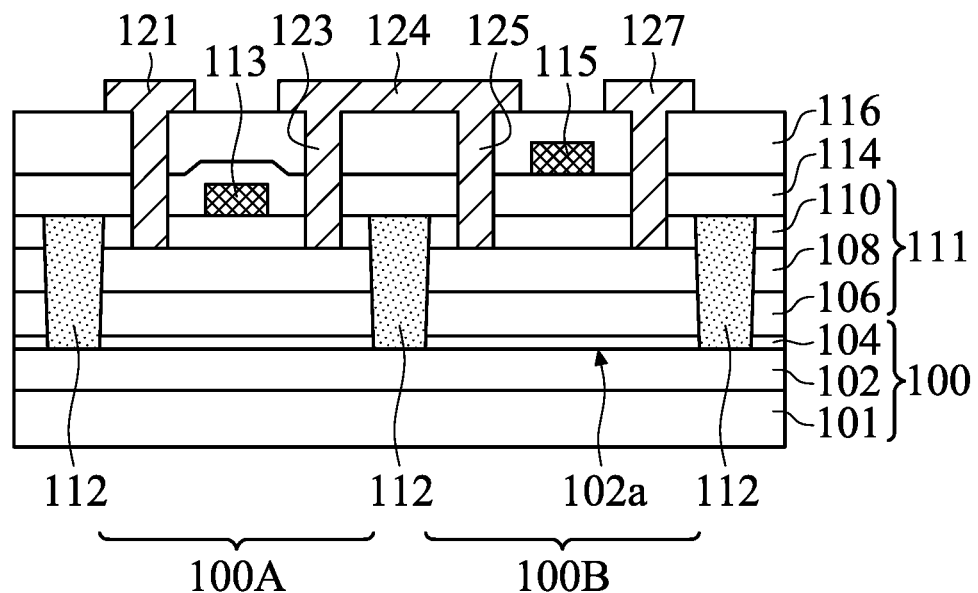
Figure 1G:
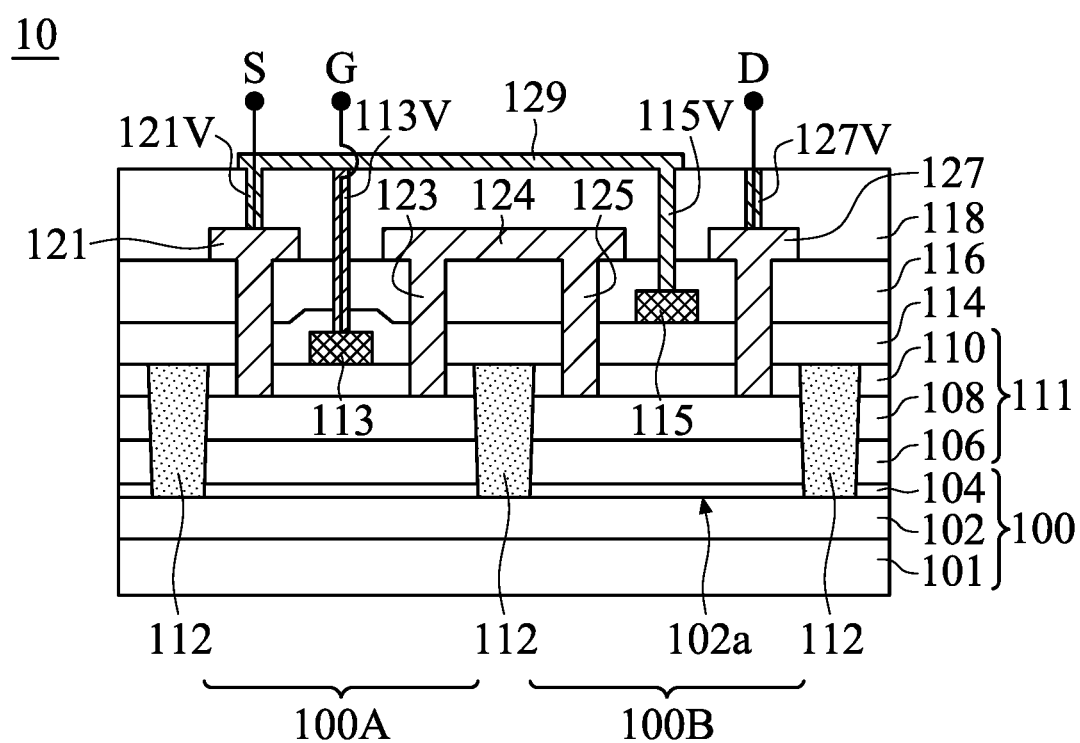

FIG. 1A-FIG. 1G illustrate cross-sectional views of intermediate steps of a method for manufacturing a semiconductor structure as shown in FIG. 1G, in accordance with some embodiments of the present disclosure.

As shown in FIG. 1A, a substrate 100 is provided. In some embodiments, the substrate 100 includes a base 101 and an insulating layer 102 disposed on the base 101. An insulating surface of the substrate 100 is provided by the insulating layer 102. In some embodiments, the substrate 100 includes a base 101 and a composite layer encapsulating the base 101. For example, the composite layer covers all of the surfaces (including the top surface, the bottom surface and all of the side surfaces) of the base 101, thereby forming the insulating layer 102 on the base 101 as depicted in FIG. 1A. In some embodiments, the base 101 of the substrate 100 includes a ceramic material. The ceramic material may include a metal inorganic material. In some embodiments, the base 101 includes silicon carbide (SiC), aluminum nitride (AlN), sapphire, or another suitable material. The aforementioned sapphire base may comprise aluminum oxide. In some embodiments, the composite layer encapsulating the base 101 includes a single insulating material layer, several insulating material layers and/or another suitable material layer. The insulating layer may include an oxide, a nitride, an oxynitride, or another suitable material. In some other embodiments, the substrate 100 may include silicon (Si), silicon carbide (SiC), gallium nitride (GaN), silicon dioxide (SiO2), sapphire or a combination thereof. For example, the substrate 100 is a silicon-on-insulator (SOI) substrate; that is, the substrate 100 includes a silicon base and an insulating layer on the silicon base. To simplify the drawings, a portion of the insulating layer 102 above the base 101 is exemplified in FIG. 1A-FIG. 1G for illustration. In some embodiments, the substrate 100 may be a single-layer substrate or a multi-layer substrate. The substrate 100 is not limited to a silicon-on-insulator (SOI) substrate, and can be a silicon wafer or a ceramic substrate. Also, the substrate 100 has a first region 100A and a second region 100B. According to some embodiments, the first region 100A of the substrate 100 is a region for forming a first device $DE_1$, and the second region 100B of the substrate 100 is a region for forming a second device $DE_2$. In some of the embodiments described below, the devices formed in the first region 100A and the second region 100B are constructed as high electron mobility transistors (HEMTs). Additionally, the positions of the first region 100A and the second region 100B can be arbitrarily selected and adjusted according to the configuration requirements of the semiconductor structures. In some embodiments, the first region 100A is adjacent to the second region 100B.

Next, a seed layer 104 is formed on the substrate 100, and an epitaxial layer 111 is formed on the seed layer 104, as shown in FIG. 1A.

In some embodiments, the seed layer 104 is made of silicon (Si) or another applicable material. In some embodiments, the methods for forming the seed layer 104 include a selective epitaxial growth (SEG) process, a chemical vapor deposition (CVD) process, a molecular beam epitaxy (MBE) process, deposition of doped amorphous semiconductor (e.g., Si) followed by a solid-phase epitaxial recrystallization (SPER) step, methods of directly pasting seed crystals, or another applicable process. The CVD process may include a vapor-phase epitaxy (VPE) process, a low pressure CVD (LPCVD) process, an ultra-high vacuum CVD (UHV-CVD) process, or another applicable process.

In some embodiments, the epitaxial layer 111 of an exemplified HEMT structure includes a buffer layer 106, a channel layer 108 and a barrier layer 110, as shown in FIG. 1A.

In some embodiments, a buffer layer 106 is formed on the seed layer 104 using an epitaxial growth process. Formation of the buffer layer 106 may be helpful to mitigate the strain on a channel layer 108 that is subsequently formed on the buffer layer 106, and to prevent defects from forming in the overlying channel layer 108. In some embodiments, the buffer layer 106 includes AlN, GaN, $Al_xGa_{1-x}N$ (wherein 0<x<1), a combination of thereof, or the like. The buffer layer 106 may be formed using a process such as hydride vapor phase epitaxy (HVPE), molecular beam epitaxy (MBE), metal organic chemical vapor deposition (MOCVD), a combination thereof, or the like. Although the buffer layer 106 in the embodiment shown in FIG. 1A is a single layer, the buffer layer 106 may be a multilayered structure in some other embodiments.

Next, a channel layer 108 is formed on the buffer layer 106 by epitaxial growth. In some embodiments, the channel layer 108 includes an undoped III-V group compound semiconductor material. For example, the channel layer 108 is made of undoped GaN, but the present disclosure is not limited thereto. In some other embodiments, the channel layer 108 includes AlGaN, AlN, GaAs, GaInP, AlGaAs, InP, InAlAs, InGaAs, other applicable III-V group compound materials, or a combination thereof. In some embodiments, the channel layer 108 is formed using a molecular-beam epitaxy method (MBE), a hydride vapor phase epitaxy method (HVPE), a metalorganic chemical vapor deposition method (MOCVD), other applicable methods, or a combination thereof.

Next, a barrier layer 110 is formed on the channel layer 108 by epitaxial growth. In some embodiments, the barrier layer 110 includes an undoped III-V group compound semiconductor material. For example, the barrier layer 110 includes undoped $Al_xGa_{1-x}N$ (wherein 0<x<1), but the present disclosure is not limited thereto. In some other embodiments, the barrier layer 110 includes GaN, AlN, GaAs, GaInP, AlGaAs, InP, InAlAs, InGaAs, other applicable III-V group compound materials, or a combination thereof. The barrier layer 110 may be formed using a molecular-beam epitaxy method (MBE), a metalorganic chemical vapor deposition method (MOCVD), a hydride vapor phase epitaxy method (HVPE), other applicable methods, or a combination thereof.

In some embodiments, the channel layer 108 and the barrier layer 110 include different materials from each other such that a heterojunction is formed between the channel layer 108 and the barrier layer 110. Therefore, a two-dimensional electron gas (2DEG) which is generated by the band gap between the hetero-materials may be formed at the interface between the channel layer 108 and the barrier layer 110. In some embodiments, the semiconductor structures, such as high electron mobility transistors (HEMTs), may utilize 2DEG as conductive carriers.

Also, in some embodiments, the epitaxial layer 111 is a GaN-containing composite layer. However, the present disclosure is not limited thereto. Besides the buffer layer 106, the channel layer 108 and the barrier layer 110, the epitaxial layer 111 may further include other films and/or layers. In some other embodiments, a carbon-doped layer is further formed between the buffer layer 106 and the channel layer 108 to increase the breakdown voltage of the semiconductor structure.

Next, referring to FIG. 1B, in some embodiments, a trench 112h is formed that penetrates through the epitaxial layer 111 until it reaches the top surface of the substrate 100. As shown in FIG. 1B, the trench 112h penetrates through the barrier layer 110, the channel layer 108, the buffer layer 106 and the seed layer 104, and the trench 112h contacts the insulating layer 102 on the base 101. In this example, the top surface 102a of the insulating layer 102 is regarded as the top surface of the substrate 100. Also, in some embodiments, the trench 112h is a portion of a closed trench viewed from the top of the substrate 100, wherein the closed trench defines the first region 100A and the second region 100B.

The method for forming the trench 112h may include forming a mask layer (not shown) on the barrier layer 110. Then, the mask layer is patterned by performing a patterning process such that a patterned mask (not shown) is formed. The patterning process includes a photolithography process and an etching process. The photolithography process includes photoresist coating (e.g., spin-on coating), soft baking, mask aligning, exposure, post-exposure baking, developing the photoresist, rinsing and drying (e.g., hard baking). The etching process includes a dry etching process or a wet etching process. As a result, a portion of the barrier layer 110 is exposed by the patterned mask. Afterwards, the trench 112h is formed by using the patterned mask as a mask and performing a dry etching process, a wet etching process, or a combination thereof.

Next, referring to FIG. 1C, in some embodiments, the trench 112h is filled with one or more insulating materials to form an isolation structure 112. Also, a first gate electrode 113 is formed on the epitaxial layer 111 (such as on the barrier layer 110), as shown in FIG. 1C.

In some embodiments, one or more insulating materials for filling the trench 112h may include a nitride, an oxide, or another suitable material to form the isolation structure 112. The isolation structure 112 with one or more insulating materials can be formed by atomic layer deposition (ALD), chemical vapor deposition (CVD), spin-on glass (SOG), flowable chemical vapor deposition (FCVD), high density plasma chemical vapor deposition (HDPCVD), or the like. In some other embodiments, the isolation structure 112 includes a liner on the sidewalls of the trench 112h.

Furthermore, in some embodiments, from a top view of the substrate 100, the isolation structure 112 is one portion of a closed structure, wherein the closed structure defines the first region 100A and the second region 100B of the substrate 100, and isolates the first region 100A from the second region 100B. As shown in FIG. 1B, the leftmost isolation structure 112 and the middle isolation structure 112 are a portion of the left sidewall and a portion of the right sidewall of the closed structure surrounding the first region 100A, respectively. Also, the middle isolation structure 112 and the rightmost isolation structure 112 in FIG. 1B are a portion of the left sidewall and a portion of the right sidewall of the closed structure surrounding the second region 100B, respectively. In some embodiments, a shape of the closed structure in a top view shape is square, rectangular, or other suitable shapes. According to the embodiments of the disclosure, the top-view shape of the closed structure and a surrounding area of the closed structure (i.e. that is, the dimensions of the first region 100A and the second region 100B) are not specifically limited, and those can be arbitrarily changed and adjusted according to the configuration requirements of the semiconductor structures in the applications.

Referring to FIG. 1C again, in some embodiments, a first gate electrode 113 is formed on the barrier layer 110 in the first region 100A, and a first dielectric layer 114 is then formed on the barrier layer 110. The first dielectric layer 114 conformally covers the isolation structure 112 and the first gate electrode 113. As shown in FIG. 1C, the first gate electrode 113 directly contacts the barrier layer 110.

In some embodiments, the first gate electrode 113 is made of p-type doped gallium nitride (GaN). In some other embodiments, the first gate electrode 113 includes aluminium gallium nitride (AlGaN), gallium nitride (GaN), aluminium nitride (AlN), gallium arsenide (GaAs), gallium indium phosphide (GaInP), aluminium gallium arsenide (AlGaAs), indium phosphide (InP), indium aluminum arsenide (InAlAs), indium gallium arsenide (InGaAs), another applicable III-V group compound material, or a combination thereof with p-type dopants. In addition, the methods for forming the first gate electrode 113 may include the aforementioned deposition or epitaxy processes, and ion implantation or in-situ doping processes.

In addition, the first dielectric layer 114 may be made of silicon oxide, silicon nitride, silicon oxynitride, a combination thereof or another applicable material. Moreover, the first dielectric layer 114 may be formed by a chemical vapor deposition (CVD) process, a physical vapor deposition (PVD) process, an atomic layer deposition (ALD) process, a high density plasma chemical vapor deposition (HDPCVD) process, or a combination thereof.

Next, referring to FIG. 1D, in some embodiments, a second gate electrode 115 is formed on the first dielectric layer 114 within the second region 100B, and a second dielectric layer 116 is formed on the first dielectric layer 114. The second gate electrode 115 directly contacts the first dielectric layer 114. The second dielectric layer 116 conformally covers the isolation structure 112 and the second gate electrode 115.

In some embodiments, the second gate electrode 115 is made of metal materials, metal silicide, polysilicon, other suitable conductive materials, or a combination thereof. For example, the metal materials can be nickel (Ni), gold (Au), another suitable metal, or a combination thereof. In some embodiments, the second gate electrode 115 may be formed by an atomic layer deposition (ALD) process, a chemical vapor deposition (CVD) process, a physical vapor deposition (PVD) process (such as sputtering deposition), or a combination thereof. In addition, in some embodiments, the methods and materials for forming the second dielectric layer 116 may be similar to, or the same as the methods and materials for forming the first dielectric layer 114, and are not repeated herein.

In some embodiments, the first gate electrode 113 is a p-type doping gallium nitride (GaN) gate electrode. The first gate electrode 113, the first source electrode 121 and the first drain electrode 123 (FIG. 1F) subsequently formed at two opposite sides of the first gate electrode 113 may form an enhancement mode (E-mode) device. The second gate electrode 115 is a metal gate electrode. The second gate electrode 115, the second source electrode 125 and the second drain electrode 127 (FIG. 1F) subsequently formed at two opposite sides of the second gate electrode 115 may form a depletion mode (D-mode) device.

Next, referring to FIG. 1E, in some embodiments, one or more patterning steps are performed on the related material layers such as the second dielectric layer 116, the first dielectric layer 114 and the barrier layer 110 to form openings. As shown in FIG. 1E, the openings 121h and 123h are formed in the first region 100A, the openings 125h and 127h are formed in the second region 100B.

In this embodiment, the openings 121h and 123h in the first region 100A are positioned at two opposite sides of the first gate electrode 113 for forming a source and a drain of a first device $DE_1$. In this embodiment, the openings 125h and 127h in the second region 100B are positioned at two opposite sides of the second gate electrode 115 for forming a source and a drain of a second device $DE_2$. In some embodiments, the openings 121h, 123h, 125h and 127h are extended to the barrier layer 110 to expose the channel layer 108.

In some embodiments, the openings 121h, 123h, 125h and 127h are simultaneously formed by using a mask layer (not shown) and an etching process. In some embodiments, the etching process may be a dry etching process, such as reactive ion etching (RIE), electron cyclotron resonance (ECR) etching, inductively-coupled plasma (ICP) etching, or the like.

In some embodiments of the present disclosure, etching equipment includes an etching chamber, a gas supply system, a bias power generator, a wafer platform, a shower head and an etching endpoint detector. The gas supply system provides an etchant which is used in the etching process. The bias power generator applies a bias power to the etching chamber to generate a bias electric field between an upper electrode (generally disposed at the top of the etching chamber) and a lower electrode (generally disposed inside of the wafer platform) of the etching equipment. The etchant is evenly dispersed into the etching chamber through the shower head. The etching endpoint detector of the etching equipment may monitor in real time the etching signals of the desired material layer to be removed in an etching process. During the etching process, the etchant is accelerated by the bias electric field in the etching chamber, and in the direction toward the wafer platform to anisotropically etch the second dielectric layer 116, the first dielectric layer 114 and the barrier layer 110.

After the openings 121h, 123h, 125h and 127h are formed, an ashing process can be performed to remove the mask layer.

Next, referring to FIG. 1F, in some embodiments, the source electrodes and the drain electrodes of the first device and the second device are formed simultaneously by depositing a conductive material in the openings 121h, 123h, 125h and 127h following by a patterning process.

In some embodiments, the first source electrode 121 and the first drain electrode 123 in the first region 100A can be formed by depositing the conductive material in the openings 121h and 123h, respectively. The second source electrode 125 and the second drain electrode 127 in the second region 100B can be formed by depositing the conductive material in the openings 125h and 127h, respectively. In some embodiments, the conductive material deposited in the openings 121h, 123h, 125h and 127h include Au, Ni, Pt, Pd, Ir, Ti, Cr, W, Al, Cu, TaN, TiN, $WSi_2$, a combination thereof, or the like.

As shown in FIG. 1F, in some embodiments, the first source electrode 121 and the first drain electrode 123 in the first region 100A are formed on the channel layer 108 and electrically connected to the channel layer 108. Also, the second source electrode 125 and the second drain electrode 127 in the second region 100B are formed on the channel layer 108 and electrically connected to the channel layer 108.

In some embodiments, the conductive material of the source electrodes and the drain electrodes may be formed by atomic layer deposition (ALD), chemical vapor deposition (CVD), physical vapor deposition (PVD), electron beam evaporation, sputtering, or the like. In some embodiments, after the conductive material of the source electrodes and the drain electrodes is deposited, a high-temperature thermal process such as an annealing process is performed to form source/drain ohmic contacts. In some embodiments, the high-temperature thermal process is a rapid thermal annealing process.

As shown in FIG. 1F, the first device $DE_1$ in the first region 100A includes the first gate electrode 113, the first source electrode 121 and the first drain electrode 123. Similarly, the second device $DE_2$ in the second region 100B includes the second gate electrode 115, the second source electrode 125 and the second drain electrode 127. According to some embodiments, the first device $DE_1$ is an enhancement mode (E-mode; also known as a normally-off device) high electron mobility transistor (HEMT), and the second device $DE_2$ is a depletion mode (D-mode) HEMT.

According to some embodiments of the present disclosure, it is noted that the first drain electrode 123 of the first device $DE_1$ (in the first region 100A) is electrically connected to the second source electrode 125 of the second device $DE_2$ (in the second region 100B). In some embodiments, as shown in FIG. 1F, after the openings 121h, 123h, 125h and 127h are deposited with the conductive material, one or more suitable patterning steps are performed, such that the first drain electrode 123 in the first region 100A is electrically connected to the second source electrode 125 in the second region 100B by a connecting portion 124. In some embodiments, the connecting portion 124, the first drain electrode 123 and the second source electrode 125 are made of the same conductive material.

Next, referring to FIG. 1G, in some embodiments, a third dielectric layer 118 is formed on the second dielectric layer 116. As shown in FIG. 1G, the third dielectric layer 118 conformably covers the first device $DE_1$ and the second device $DE_2$. The first dielectric layer 114, the second dielectric layer 116 and the third dielectric layer 118 form an interlayer dielectric (ILD) layer. In addition, in some embodiments, the methods and materials for forming the third dielectric layer 118 may be similar to, or the same as the methods and materials for forming the second dielectric layer 116 and the first dielectric layer 114, and are not repeated herein.

Next, as shown in FIG. 1G, in some embodiments, the conductive vias 121V and 113V are formed on the first source electrode 121 and the first gate electrode 113 of the first device $DE_1$, respectively. The conductive vias 115V and 127V are formed on the second gate electrode 115 and the second drain electrode 127 of the second device $DE_2$, respectively. Also, the second gate electrode 115 of the second device $DE_2$ is electrically connected to the first source electrode 121 of the first device $DE_1$ by a connecting portion 129. It is noted that the connecting portion 129 as depicted in FIG. 1G does not electrically contact the conductive via 113V on the first gate electrode 113. In addition, in some embodiments, the methods and materials for forming the conductive vias 121V, 113V, 115V, 127V and the connecting portion 129 may be similar to, or the same as the methods and materials for forming the source electrodes/drain electrodes (materials filling into the opening 121h, 123h, 125h and 127h) and the connecting portion 124, and are not repeated herein.

According to some embodiments of the disclosure, the second gate electrode 115 of the second device $DE_2$ in the second region 100B is electrically connected to the first source electrode 121 of the first device $DE_1$ in the first region 100A. As shown in FIG. 1G, the second gate electrode 115 is electrically connected to the first source electrode 121 by the connecting portion 129. In some embodiments, the conductive vias 121V, 113V, 115V, 127V and the connecting portion 124 are made of the same conductive material.

According to the semiconductor structure in some embodiments, several devices are electrically connected to each other as a cascade for high-voltage applications. In some embodiments, the device formed in the first region 100A is an enhancement mode (E-mode) device (e.g. the first device $DE_1$ is an enhancement mode HEMT), and the device formed in the second region 100B is a depletion mode (D-mode) device (e.g. the second device $DE_2$ is a depletion mode HEMT), wherein the first drain electrode 123 in the first region 100A is electrically connected to the second source electrode 125 in the second region 100B. Furthermore, in some embodiments, the second gate electrode 115 of the second device $DE_2$ in the second region 100B is electrically connected to the first source electrode 121 of the first device $DE_1$ in the first region 100A. When the semiconductor structure as shown in FIG. 1G is operating, related voltages are applied to the terminals S, G, D, respectively. For example, in some embodiments, a source voltage is applied to the terminal S and reaches the first source electrode 121 through the conductive vias 121V, a gate voltage is applied to the terminal G and reaches the first gate electrode 113 through the conductive vias 113V, and a drain voltage is applied to the terminal D and reaches the second drain electrode 127 through the conductive vias 127V. As shown in the semiconductor structure 10 in FIG. 1G, the first device $DE_1$ functions as a switch, such that the second device $DE_2$ can be turned off by the first device $DE_1$ (Vgs<0).

In some embodiments, according to the semiconductor structure 10 in the form of a cascade, each of the first device $DE_1$ and the second device $DE_2$ to withstand about 650V of operation is constructed on the same substrate, thereby implementing the high-voltage applications (of about 1200V-1300V). That is, the epitaxial layer 111 only needs to withstand about 650V of operation. In other words, when 0V and 1200V are respectively applied to the first source electrode 121 and the second drain electrode 127, each of the first drain electrode 123 and the second source electrode 125 electrically connected to each other is at about 600V.

Therefore, the semiconductor structure 10 including several devices connected to each other as a cascade, in accordance with some embodiments, can efficiently implement the high-voltage applications or ultra-high voltage applications without forming a very thick epitaxial layer 111. For example, the original thickness 5 μm to 10 μm of the epitaxial layer 111 can be effectively reduced to about 1 μm to 5 μm by coupling the first deice $DE_1$ to the second device $DE_2$. The epitaxial layer 111 with a reduced thickness not only reduces the epitaxial growth time, but also significantly reduces the weight of the epitaxial layer 111 on the substrate 100 and eases the stress generated by the epitaxial layer 111 on the substrate 100. Accordingly, the epitaxial layer 111 peeling off the substrate 100 can be effectively prevented. Thus, the semiconductor structure provided in some embodiments of the present disclosure can reduce the production cost and increase the product reliability.

Furthermore, a method for manufacturing a semiconductor structure as a system on chip (SoC) is provided, in accordance with some embodiments, which is easy to implement and has low production cost. According to the method for manufacturing the semiconductor structure as shown in FIG. 1A to FIG. 1G, the first device $DE_1$ and the second device $DE_2$ can be constructed on the same substrate 100. The portions of the epitaxial layer respectively corresponding to the different devices are isolated from each other by an isolation structure 112. Also, the devices in the different regions are electrically connected to each other by the connecting portions 124 and 129 (such as metal wires). Compared with a conventional fabrication of a system in package (SiP) (i.e. several individual devices are integrated in one package by wire bonding), the method for manufacturing the semiconductor structure in some embodiments does not use bonding wires for coupling the different devices (e.g. transistors), which can prevent the noise induced by the parasitic inductance and the parasitic capacitance (typically produced from the bonding wires), and reduce the spike of current (typically causing by a high change rate of input current (di/dt)). The smaller the spike of current swing, the less likely the device is to be damaged. Accordingly, the electrical characteristics and the product reliability of the semiconductor structures in some embodiments of the present disclosure can be significantly improved.

According to some embodiments of the present disclosure, several depletion mode (D-mode) devices can be formed in the second region 100B and connected to each other as a cascade, thereby forming a semiconductor structure capable of being operated at high voltages or ultra-high voltages.

Figure 2:
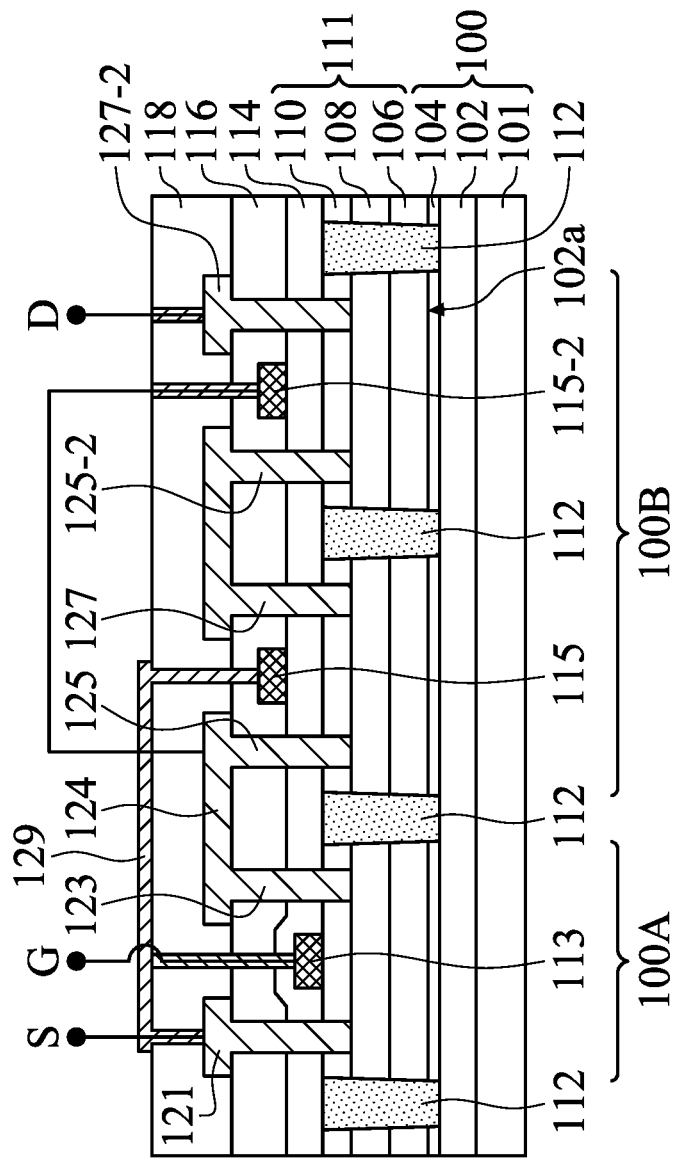
FIG. 2 is a cross-sectional view of a semiconductor structure in accordance with some embodiments of the present disclosure.

FIG. 2 is a cross-sectional view of a semiconductor structure in accordance with some embodiments of the present disclosure. The difference between the semiconductor structure 20 in FIG. 2 and the semiconductor structure 10 in FIG. 1G is that two depletion mode (D-mode) devices connected to each other as a cascade are formed in the second region 100B of the semiconductor structure 20 in FIG. 2, thereby further reducing the sustaining voltage required for each of the transistors. In other words, the semiconductor structure 20 with two D-mode devices in the second region 100B, as shown in FIG. 2, can increases the voltage applied to the semiconductor structure 20. Also, similar or the same reference numbers are used to designate the similar or the identical features/components in FIG. 2 and FIG. 1A-FIG. 1G, and the description of the similar or the identical features/components are not repeated herein.

In some embodiments, as shown in FIG. 2, the semiconductor structure 20 includes an enhancement mode (E-mode) transistor such as a first device $DE_1$ disposed in the first region 100A, and two depletion mode (D-mode) transistors such as a second device $DE_2$ and a third device $DE_3$ disposed in the second region 100B. Also, the semiconductor structure 20 further includes another isolation structure 112 on the substrate 100, and the portions of the epitaxial layer 111 respectively corresponding to the second device $DE_2$ and the third device $DE_3$ are isolated from each other by this isolation structure 112. In some embodiments, the first device $DE_1$ is an enhancement mode (E-mode) high electron mobility transistor (HEMT), and the second device $DE_2$ and the third device $DE_3$ are depletion mode (D-mode) HEMTs.

In some embodiments, the third device $DE_3$ includes the third gate electrode 115-2, the third source electrode 125-2 and the third drain electrode 127-2. The third gate electrode 115-2 is formed on the first dielectric layer 114. The third source electrode 125-2 and the third drain electrode 127-2 are positioned at two opposite sides of the third gate electrode 115-2. Also, the third source electrode 125-2 and the third drain electrode 127-2 are extended to the barrier layer 110 and contact the channel layer 108. The components of the third device $DE_3$, the materials and processes used to form the third device $DE_3$ may be similar to, or the same as, those used to form the second device $DE_2$, and are not repeated herein.

Also, the electrical connections between the three devices are similar to the electrical connections described in the aforementioned example. For example, in some embodiments, the first drain electrode 123 of the first device $DE_1$ is electrically connected to the second source electrode 125 of the second device $DE_2$, and the second drain electrode 127 of the second device $DE_2$ is electrically connected to the third source electrode 125-2 of the third device $DE_3$.

Furthermore, the gate electrode of the device (such as the D-mode transistor) in the second region 100B of the substrate 100 is electrically connected to the source electrode of another device, such as the transistor disposed adjacently. For example, in some embodiments, the second gate electrode 115 of the second device $DE_2$ is electrically connected to the first source electrode 121 of the first device $DE_1$, and the third gate electrode 115-2 of the third device $DE_3$ is electrically connected to the second source electrode 125 of the second device $DE_2$. When the semiconductor structure 20 as shown in FIG. 2 is operating, a source voltage is applied to the terminal S of the first source electrode 121, a gate voltage is applied to the terminal G to the first gate electrode 113, and a drain voltage is applied to the terminal D to the third drain electrode 127-2. As shown in the semiconductor structure 20 in FIG. 2, the first device $DE_1$ functions as a switch of the semiconductor structure 20, such that the second device $DE_2$ and the third device $DE_3$ can be turned off by the first device $DE_1$.

According to the semiconductor structure 20 in the form of a cascade as shown in FIG. 2, if a high-voltage application of about 1200V is required to be implemented, the epitaxial layer 111 only needs to withstand about 450V of operation. The first device $DE_1$, the second device $DE_2$ and the third device $DE_3$ can be formed on the same substrate and a high-voltage application of about 1200V can be implemented by constructing each of those devices capable of withstanding about 450V of operation. In addition, when 0V and 1200V are respectively applied to the first source electrode 121 and the third drain electrode 127-2, each of the first drain electrode 123 and the second source electrode 125 electrically connected to each other is at about 800V, while each of the second drain electrode 127 and the third source electrode 125-2 is at about 400V.

Figure 3:
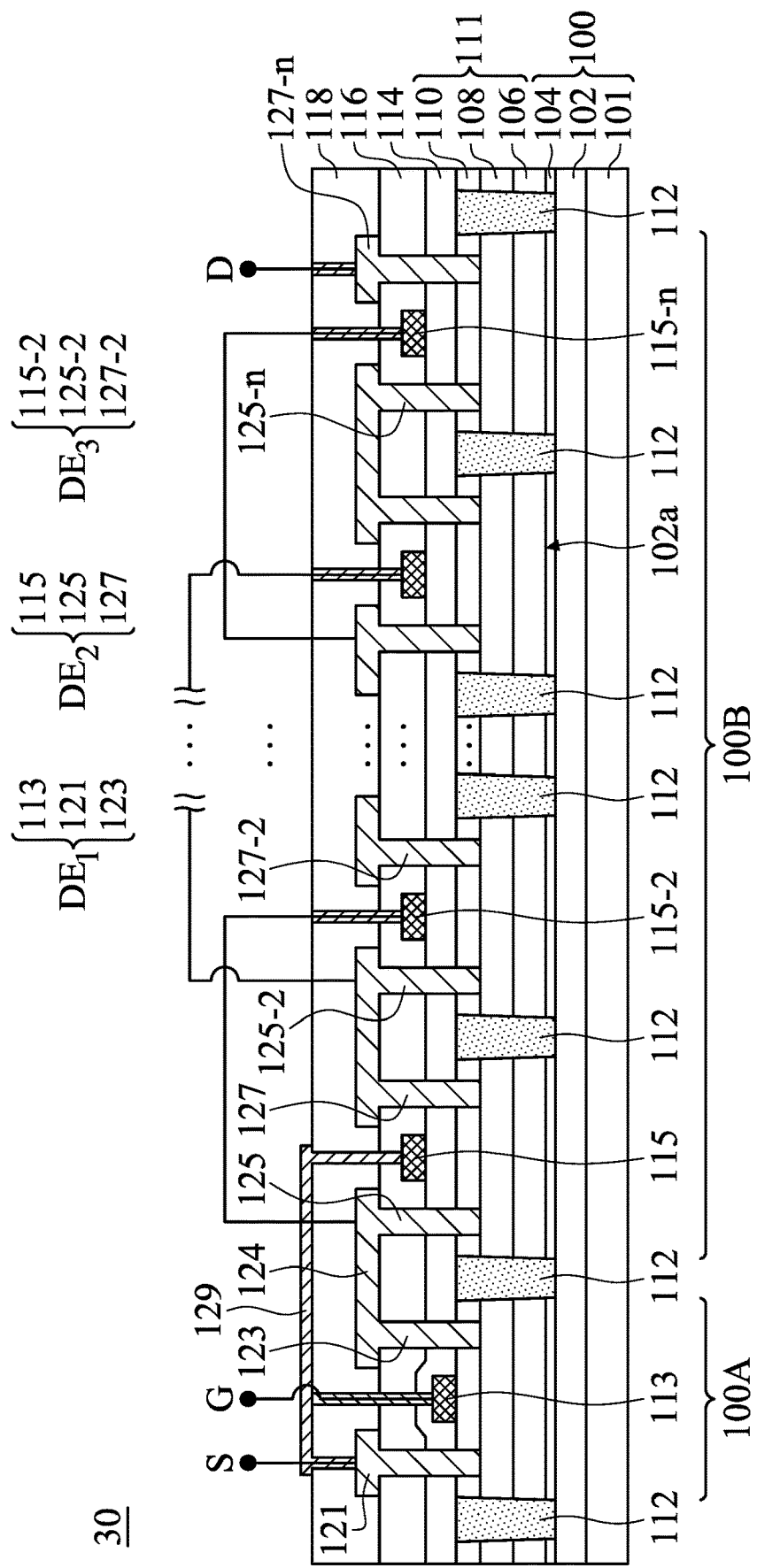
FIG. 3 is a cross-sectional view of another semiconductor structure in accordance with some embodiments of the present disclosure.

Additionally, according to some embodiments of the present disclosure, n depletion mode (D-mode) devices are formed in the second region 100B and connected to each other as a cascade, wherein n is a positive integer that is equal to or greater than 3. FIG. 3 is a cross-sectional view of a semiconductor structure in accordance with some embodiments of the present disclosure. The features/components in FIG. 3 similar or identical to the features/components in FIG. 2 and FIG. 1A-FIG. 1G are designated with similar or the same reference numbers, and the description of those similar or the identical features/components are not repeated herein.

In some embodiments, as shown in FIG. 3, the semiconductor structure 30 includes an enhancement mode (E-mode) transistor such as a first device $DE_1$ disposed in the first region 100A, and n depletion mode (D-mode) transistors such as a second device $DE_2$, a third device $DE_3$, ... and a (n+1)-th device $DE_{(n+1)}$ disposed in the second region 100B, wherein n is a positive integer that is equal to or greater than 3. Also, the semiconductor structure 30 includes several isolation structures 112 on the substrate 100, and the portions of the epitaxial layer 111 respectively corresponding to those devices are isolated from each other by the isolation structures 112. In some embodiments, the first device $DE_1$ is an enhancement mode (E-mode) high electron mobility transistor (HEMT), and the second device $DE_2$, the third device $DE_3$, ... and the (n+1)-th device $DE_{(n+1)}$ are depletion mode (D-mode) HEMTs.

In some embodiments, those devices disposed in the second region 100B include similar components and configurations. For example, the (n+1)-th device $DE_{(n+1)}$ include the (n+1)-th gate electrode 115-n, the (n+1)-th source electrode 125-n and the (n+1)-th drain electrode 127-n. The (n+1)-th gate electrode 115-n is formed on the first dielectric layer 114. The (n+1)-th source electrode 125-n and the (n+1)-th drain electrode 127-n are positioned at two opposite sides of the (n+1)-th gate electrode 115-n. Also, the (n+1)-th source electrode 125-n and the (n+1)-th drain electrode 127-n are extended to the barrier layer 110 and contact the channel layer 108. The components, materials and processes used to form the devices in the second region 100B may be similar to, or the same as, those used to form the second device $DE_2$, and are not repeated herein.

Moreover, the electrical connections between those devices are similar to the electrical connections described in the aforementioned example. For example, in some embodiments, the first drain electrode 123 of the first device $DE_1$ is electrically connected to the second source electrode 125 of the second device $DE_2$, the second drain electrode 127 of the second device $DE_2$ is electrically connected to the third source electrode 125-2 of the third device $DE_3$, the n-th drain electrode 127-(n−1) of the n-th device $DE_n$ is electrically connected to the (n+1)-th source electrode 125-n of the (n+1)-th device $DE_{(n+1)}$, and so on.

Furthermore, the gate electrode of the device (such as the D-mode transistor) in the second region 100B of the substrate 100 is electrically connected to the source electrode of another device, such as the transistor disposed adjacently. For example, in some embodiments, the second gate electrode 115 of the second device $DE_2$ is electrically connected to the first source electrode 121 of the first device $DE_1$, the third gate electrode 115-2 of the third device $DE_3$ is electrically connected to the second source electrode 125 of the second device $DE_2$, the (n+1)-th gate electrode 115-n of the (n+1) device $DE_{(n+1)}$ is electrically connected to the n-th source electrode 125-(n−1) of the n-th device $DE_n$, and so on.

When the semiconductor structure 30 as shown in FIG. 3 is operating, a source voltage is applied to the terminal S of the first source electrode 121, a gate voltage is applied to the terminal G to the first gate electrode 113, and a drain voltage is applied to the terminal D to the (n+1)-th drain electrode 127-n. As shown in the semiconductor structure 30 in FIG. 3, the first device $DE_1$ functions as a switch of the semiconductor structure 30, such that the second device $DE_2$, the third device $DE_3$, ... and the (n+1)-th device $DE_{(n+1)}$ in the second region 100B can be turned off by the first device $DE_1$.

According to the semiconductor structure 30 as shown in FIG. 3, if a high-voltage application of about 1200V is required to be implemented, the epitaxial layer 111 only needs to withstand about (1200/(n+1)) V for 1200V operation. For example, when n is equal to 4, one enhancement mode (E-mode) transistor and four depletion mode (D-mode) transistors are formed on the substrate 100; therefore, the epitaxial layer 111 only needs to withstand about 280V to about 300V (i.e. (1200/5)=240V) for steady operation. Also, the first device $DE_1$, the second device $DE_2$, the third device $DE_3$, the fourth device $DE_4$, and the fifth device $DE_5$ can be formed on the same substrate, and a high-voltage application of about 1200V can be implemented by constructing each of those devices capable of withstanding about 280V to about 300V of operation.

Figure 4:
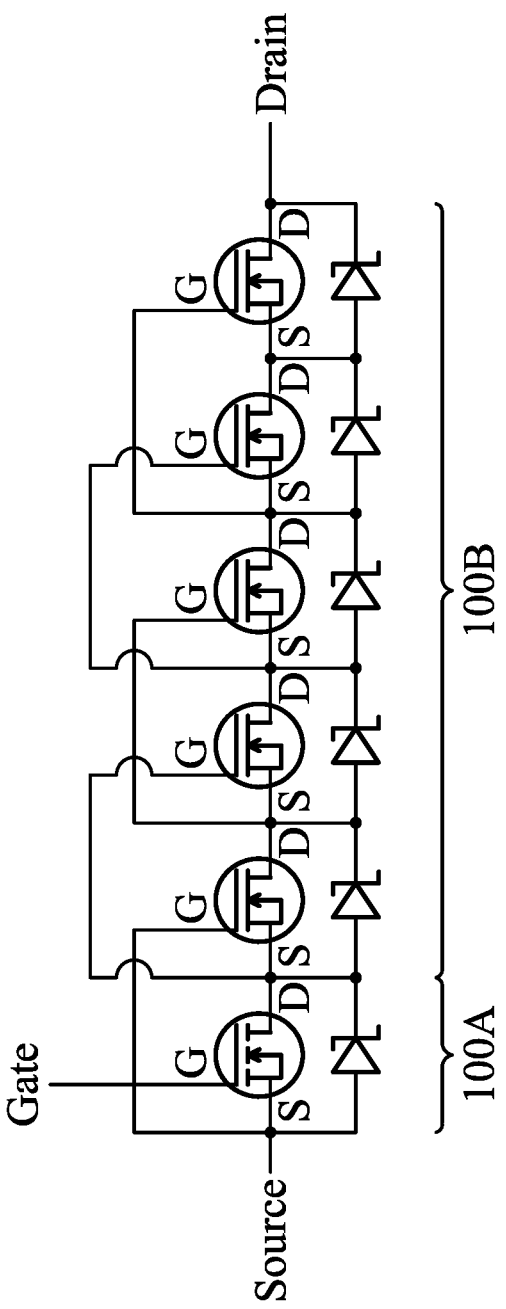
FIG. 4 is an equivalent circuit diagram of a semiconductor structure in accordance with some embodiments of the present disclosure.

FIG. 4 is an equivalent circuit diagram of a semiconductor structure 40 in accordance with some embodiments of the present disclosure. The semiconductor structure 40 includes one enhancement mode (E-mode) transistor in the first region 100A and five depletion mode (D-mode) transistors in the second region 100B. The features/components of the semiconductor structure 40 in FIG. 4 can be referred to the features/components such as the first device $DE_1$, the second device $DE_2$ and the third device $DE_3$ of the semiconductor structure 20/30 in FIG. 1G/FIG. 2/FIG. 3.

Although more devices coupled to each other on the substrate 100 can reduce the thickness of the epitaxial layer 111 and lower the required voltage that each device must withstand, it does increase the area of the substrate 100. Thus, a trade-off between several factors, such as the reduced thickness of the epitaxial layer corresponding to the increased number of the devices, the increased area of the substrate and the size of the product in the application, can be considered for determining the number of the devices coupled to each other on the substrate 100.

In addition, the disclosure is not limited to the semiconductor structures provided in the above embodiments. In some other embodiments, the semiconductor structure may include other components/features to further improve the electrical performance of the semiconductor structure.

In some embodiments, the parasitic charges generated during the plasma etching process can be accumulated in the seed layer 104 under the epitaxial layer 111. The parasitic charges accumulated in the seed layer 104 will cause the increase of the dynamic on-resistance (R-on) and lead to the decreases of the on current (I-on), thereby failing the electric circuit and affecting the electrical performance of the semiconductor structures. In the following descriptions, the semiconductor structures in some other embodiments are provided to solve the problem of parasitic charges accumulated in the seed layer 104.

Figure 5:
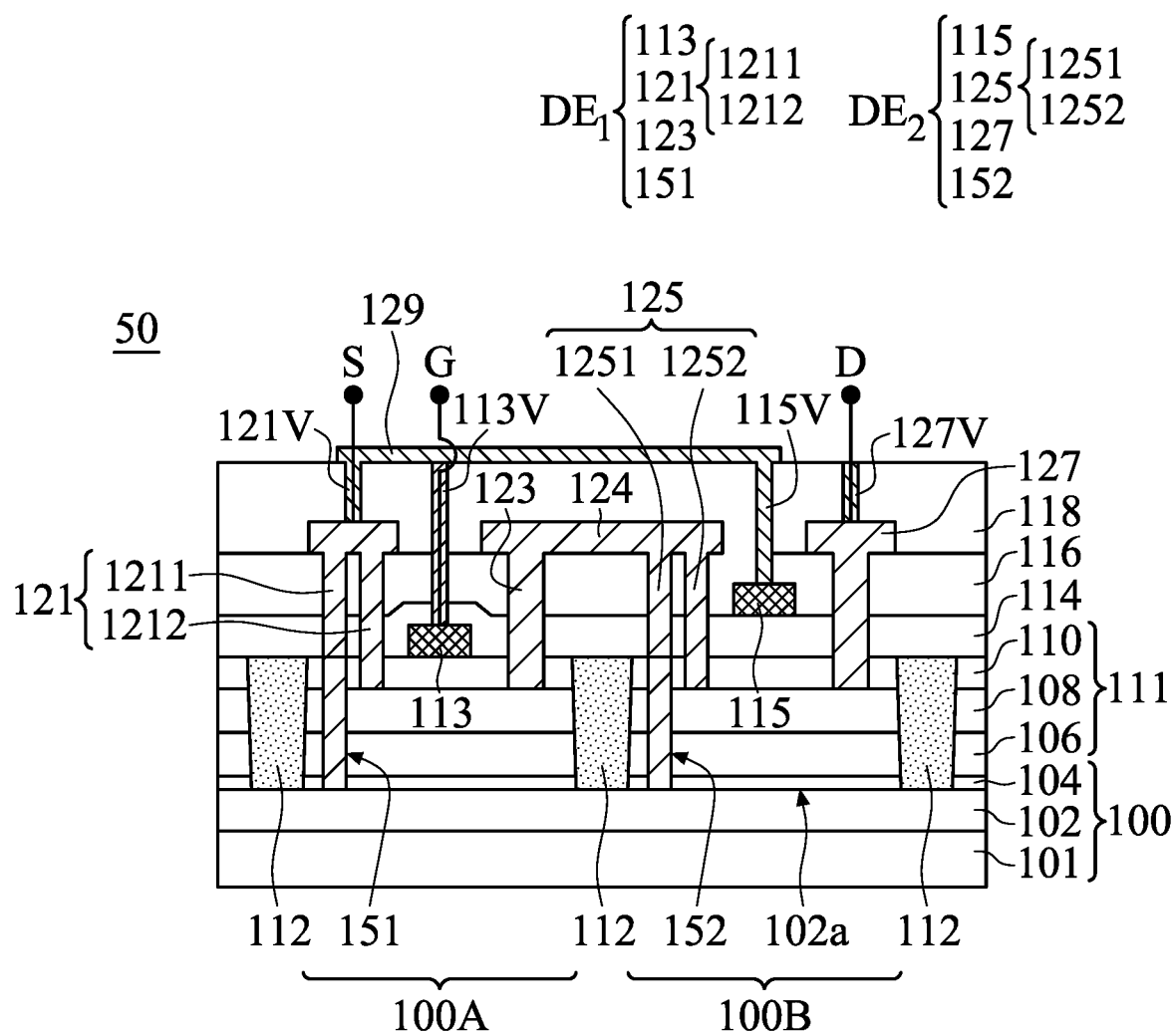
FIG. 5 is a cross-sectional view of still another semiconductor structure in accordance with some other embodiments of the present disclosure.

FIG. 5 is a cross-sectional view of a semiconductor structure 50 in accordance with some other embodiments of the present disclosure. The features/components of the semiconductor structure 50 in FIG. 5 similar or identical to the features/components of the semiconductor structure 20 in FIG. 1G can be designated by the same or similar reference numbers. Also, the related configuration, the materials and the methods for the features/components of the devices, and the electrical connection between the devices can be referred to the descriptions in the above-mentioned embodiments, and those details are not repeated herein.

The difference between the semiconductor structure 50 in FIG. 5 and the semiconductor structure 10 in FIG. 1G is that the source electrode of each device of the semiconductor structure 50 includes two conducting portions electrically connected to each other. Also, one of the conducting portions is electrically connected to the seed layer 104 by a through hole, thereby releasing the charges generated by the plasma etching process which have accumulated in the seed layer 104.

As shown in FIG. 5, in some embodiments, the first source electrode 121 of the first device $DE_1$ includes a first conducting portion 1211 and a second conducting portion 1212 electrically connected to each other. Also, the first conducting portion 1211 and/or the second conducting portion 1212 penetrate through the epitaxial layer 111 and are/is in contact with the seed layer 104.

Similarly, in some embodiments, the second source electrode 125 of the second device $DE_2$ includes a third conducting portion 1251 and a fourth conducting portion 1252 electrically connected to each other. Also, the third conducting portion 1251 and/or the fourth conducting portion 1252 penetrate through the epitaxial layer 111 and is in contact with the seed layer 104. In this example, the third conducting portion 1251 penetrates through the epitaxial layer 111 and is in contact with the seed layer 104, thereby releasing the charges accumulated in the seed layer 104.

When the semiconductor structure 50 as shown in FIG. 5 is operating at a high-voltage (such as at a voltage above 600V), the conductive material filling in the through holes 151 and 151 provide the releasing paths for releasing the charges accumulated in the seed layer 104, thereby solving the problem caused by the randomly moving parasitic charges at a high-voltage operation. Therefore, the electrical performance of the semiconductor structure 50 as shown in FIG. 5 can be further improved by forming one or more paths for releasing the parasitic charges.

Figure 6:
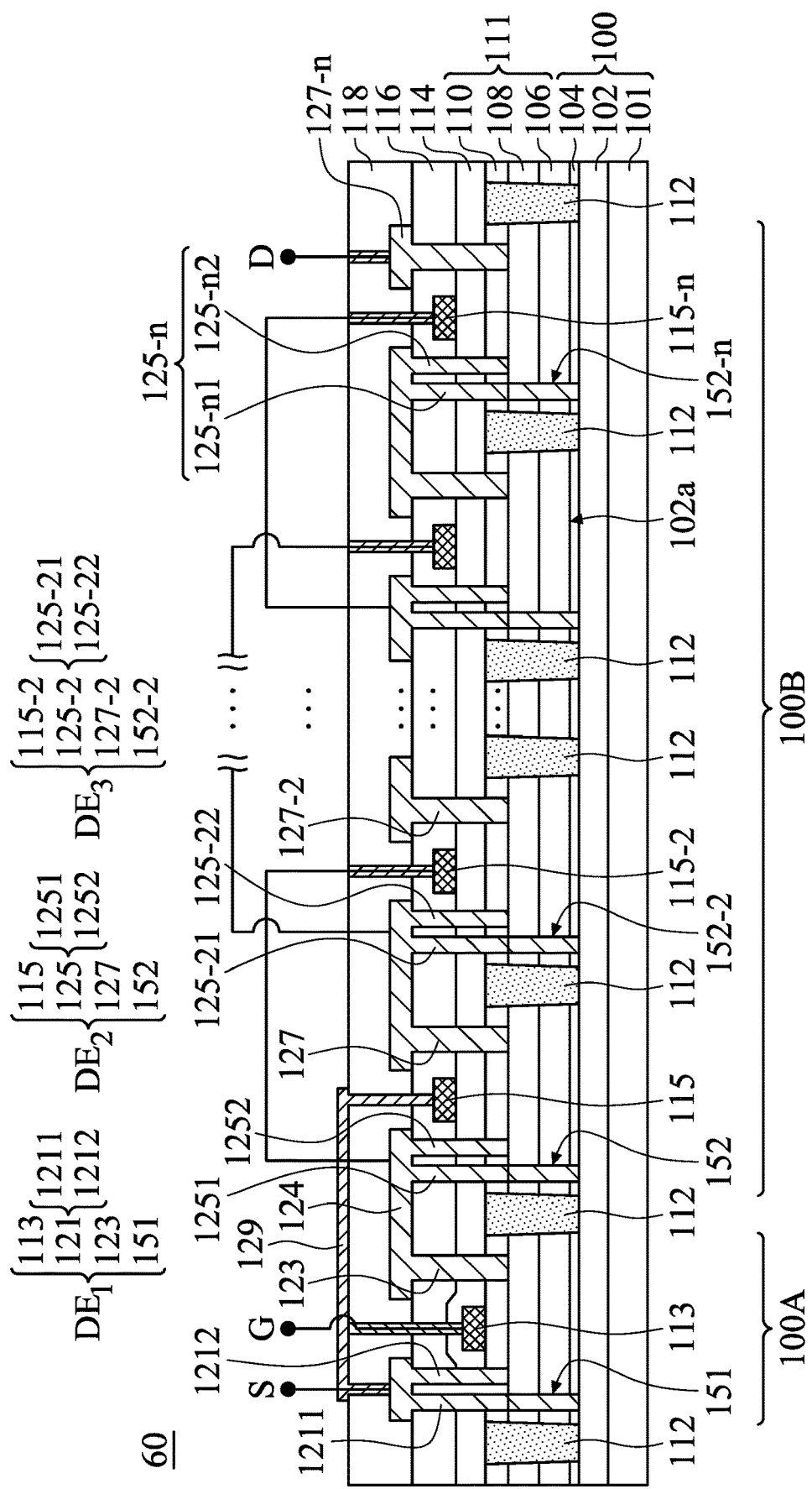
FIG. 6 is a cross-sectional view of yet another semiconductor structure in accordance with some other embodiments of the present disclosure.

According to the semiconductor structures in some other embodiments, two or more depletion mode (D-mode) transistors can be disposed in the second region 100B and coupled to each other. FIG. 6 is a cross-sectional view of a semiconductor structure 60 in accordance with some other embodiments of the present disclosure. The features/components in FIG. 6 similar or identical to the features/components in FIG. 3 and FIG. 5 are designated with similar or the same reference numbers, and the description of those similar or the identical features/components are not repeated herein.

As shown in FIG. 6, n depletion mode (D-mode) devices are formed in the second region 100B of the semiconductor structure 60, and those D-mode devices are connected to each other as a cascade, wherein n is a positive integer that is equal to or greater than 3. Also, in some embodiments, the source electrode of each device of the semiconductor structure 60 includes two conducting portions (such as the first conducting portion 1211 and the second conducting portion 1212, the third conducting portion 1251 and the fourth conducting portion 1252, the conducting portions 125-21 and 125-22, . . . , the conducting portions 125-$n$1 and 125-$n$2) electrically connected to each other. Also, one of the conducting portions of each source electrode penetrates through the epitaxial layer 111 by the through holes (such as 151, 152, 152-2, . . . , 152-$n$) and is in contact with the seed layer 104.

Therefore, there are several advantages to operate the semiconductor structure 60 as shown in FIG. 6 at a high-voltage (such as at a voltage above 600V) or at an ultra-high voltage, such as reducing the thickness of the epitaxial layer, lowering the required voltage that each device must withstand and the devices manufactured on the same substrate. Also, the conductive material filling in the through holes provide the releasing paths for releasing the charges accumulated in the seed layer 104, thereby preventing the randomly movement of the parasitic charges at a high-voltage operation. Therefore, the electrical performance of the semiconductor structure 60 as shown in FIG. 6 has been further improved by forming the paths for releasing the parasitic charges.

According to the aforementioned descriptions, the semiconductor structure in some embodiments includes several devices such as transistors connected to each other as a cascade. In some embodiments, the semiconductor structure can be used in high-voltage applications or ultra-high voltage applications without the need to form a thick epitaxial layer. For a semiconductor structure, the epitaxial layer with a reduced thickness not only reduces the epitaxial growth time, but also significantly reduces the weight of the epitaxial layer 111 on the substrate 100 and eases the stress generated by the epitaxial layer on the substrate. Also, each device included in the semiconductor structure, in accordance with some embodiments, can be a device that merely withstands a voltage lower than an operation voltage. According to the embodiments, a high-voltage application of about 1200V can be implemented by cascading the devices of the semiconductor structure. Additionally, the method for manufacturing the semiconductor structure in accordance with some embodiments is a method for fabricating a system on chip (SoC), which is easy to implement and has low production cost. According to the method for manufacturing the semiconductor structure in some embodiments, several devices, such as one enhancement mode (E-mode) transistor and one or more depletion mode (D-mode) transistors cascaded to each other, can be constructed on the same substrate. The portions of the epitaxial layer respectively corresponding to the different devices are isolated from each other by one or more isolation structures. According to the embodiments as provided above, the cascaded devices (such as transistors) of the semiconductor structure do not use the bonding wires for electrical connections, which can prevent the noise induced by the parasitic inductance and the parasitic capacitance (typically produced from the bonding wires), and reduce the spike of current (typically causing by a high change rate of input current (di/dt)). The smaller the spike of current swing, the less likely the device is to be damaged. Also, in some other embodiments, the semiconductor structure may include other components/features to further improve the electrical performance of the semiconductor structure. For example, the source electrode of each device of the semiconductor structure may further include at least two conducting portions, and one of the conducting portions is electrically connected to the seed layer to build a path for releasing the parasitic charges accumulated in the seed layer. Therefore, the electrical performance of the semiconductor structure can be further improved by forming one or more paths for releasing the parasitic charges accumulated in the seed layer. Accordingly, the electrical characteristics and the product reliability of the semiconductor structures in some embodiments of the present disclosure can be significantly improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising: a substrate, having a first region and a second region; an epitaxial layer above the substrate; a first device on the first region of the substrate, the first device comprising: a first gate electrode on the epitaxial layer, wherein a dielectric layer is disposed on the epitaxial layer and covers the first gate electrode; a first source electrode and a first drain electrode disposed at two opposite sides of the first gate electrode; a second device on the second region of the substrate, the second device comprising: a second gate electrode disposed above the dielectric layer, wherein a lowermost surface of the second gate electrode is formed on a top surface of the dielectric layer; a second source electrode and a second drain electrode disposed at two opposite sides of the second gate electrode, wherein the second source electrode comprising two second connecting portions is electrically connected to the first drain electrode via a connecting portion connecting the second source electrode and the first drain electrode; and an isolation structure on the substrate, wherein portions of the epitaxial layer respectively disposed in the first region and the second region are isolated from each other by the isolation structure.

2. The semiconductor structure as claimed in claim 1, wherein the second gate electrode of the second device is electrically connected to the first source electrode of the first device.

3. The semiconductor structure as claimed in claim 1, wherein the isolation structure penetrates through the epitaxial layer and contacts a top surface of the substrate.

4. The semiconductor structure as claimed in claim 1, further comprising a seed layer disposed on the substrate, wherein the epitaxial layer is disposed on the seed layer.

5. The semiconductor structure as claimed in claim 4, wherein the isolation structure penetrates through the epitaxial layer and the seed layer, and the isolation structure contacts a top surface of the substrate.

6. The semiconductor structure as claimed in claim 4, wherein the first source electrode comprises two first conducting portions electrically connected to each other, and the first device further comprises a first through hole electrically connected to one of the first conducting portions, wherein the first through hole penetrates through the epitaxial layer and contacts the seed layer.

7. The semiconductor structure as claimed in claim 6, wherein the two second conducting portions are electrically connected to each other, and the second device further comprises a second through hole electrically connected to one of the second conducting portions, wherein the second through hole penetrates through the epitaxial layer and contacts the seed layer.

8. The semiconductor structure as claimed in claim 1, wherein the first gate electrode comprises a p-type doping gallium nitride (GaN) material, and the second gate electrode comprises metal or polysilicon.

9. The semiconductor structure as claimed in claim 1, wherein the first device is a high-voltage enhancement mode transistor, and the second device is a high-voltage depletion mode transistor.

10. The semiconductor structure as claimed in claim 1, further comprising an interlayer dielectric layer on the epitaxial layer and covering the first device and the second device, wherein the interlayer dielectric layer comprises the dielectric layer covering the first gate electrode and another dielectric layer covering the second gate electrode.

11. The semiconductor structure as claimed in claim 1, further comprising:
a third device on the second region of the substrate, and the third device comprising:
a third gate electrode on the dielectric layer;
a third source electrode and a third drain electrode disposed at two opposite sides of the third gate electrode,
wherein the third source electrode of the third device is electrically connected to the second drain electrode of the second device.

12. The semiconductor structure as claimed in claim 11, wherein the third gate electrode of the third device is electrically connected to the second source electrode of the second device.

13. The semiconductor structure as claimed in claim 11, further comprising:
another isolation structure disposed on the substrate, so that other portions of the epitaxial layer corresponding to the second device and the third device are isolated from each other by said another isolation structure.

14. The semiconductor structure as claimed in claim 11, wherein the first device is a high-voltage enhancement mode transistor, and the second device and the third device are high-voltage depletion mode transistors.

15. The semiconductor structure as claimed in claim 1, wherein the substrate comprises a base and an insulating layer disposed on the base, and the epitaxial layer is disposed on the insulating layer.

16. A method for manufacturing a semiconductor structure, comprising: providing a substrate, wherein the substrate has a first region and a second region; forming an epitaxial layer above the substrate; forming an isolation structure on the substrate, wherein portions of the epitaxial layer respectively disposed in the first region and the second region are isolated from each other by the isolation structure; forming a first device on the first region of the substrate, and the first device comprising: a first gate electrode on the epitaxial layer, wherein a dielectric layer is formed on the epitaxial layer and covers the first gate electrode; a first source electrode and a first drain electrode disposed at two opposite sides of the first gate electrode; and forming a second device on the second region of the substrate, and the second device comprising: a second gate electrode disposed above the dielectric layer, wherein a lowermost surface of the second gate electrode is formed on a top surface of the dielectric layer; a second source electrode and a second drain electrode disposed at two opposite sides of the second gate electrode, wherein the second source electrode comprising two second connecting portions is electrically connected to the first drain electrode via a connecting portion connecting the second source electrode and the first drain electrode.

17. The method for manufacturing the semiconductor structure as claimed in claim 16, wherein the second gate electrode of the second device is electrically connected to the first source electrode of the first device.

18. The method for manufacturing the semiconductor structure as claimed in claim 16, wherein the isolation structure penetrates through the epitaxial layer and contacts a top surface of the substrate.

19. The method for manufacturing the semiconductor structure as claimed in claim 16, further comprising forming a seed layer on the substrate, wherein the epitaxial layer is formed on the seed layer.

20. The method for manufacturing the semiconductor structure as claimed in claim 19, wherein the isolation structure penetrates through the epitaxial layer and the seed layer, and the isolation structure contacts a top surface of the substrate.

21. The method for manufacturing the semiconductor structure as claimed in claim 19, wherein the first source electrode comprises two first conducting portions electrically connected to each other, and the first device further comprises a first through hole electrically connected to one of the first conducting portions, wherein the first through hole penetrates through the epitaxial layer and contacts the seed layer.

22. The method for manufacturing the semiconductor structure as claimed in claim 19, wherein the two second conducting portions are electrically connected to each other, and the second device further comprises a second through hole electrically connected to one of the second conducting portions, wherein the second through hole penetrates through the epitaxial layer and contacts the seed layer.

23. The method for manufacturing the semiconductor structure as claimed in claim 16, wherein the first device is a high-voltage enhancement mode transistor, and the second device is a high-voltage depletion mode transistor.

24. The method for manufacturing the semiconductor structure as claimed in claim 16, wherein the semiconductor structure further comprises an interlayer dielectric layer on the epitaxial layer, and the interlayer dielectric layer covers the first device and the second device, wherein the interlayer dielectric layer comprises the dielectric layer covering the first gate electrode and another dielectric layer covering the second gate electrode.

25. The method for manufacturing the semiconductor structure as claimed in claim 16, further comprising:
    forming a third device on the second region of the substrate, the third device comprising:
        a third gate electrode on the dielectric layer;
        a third source electrode and a third drain electrode disposed at two opposite sides of the third gate electrode,
        wherein the third source electrode of the third device is electrically connected to the second drain electrode of the second device.

26. The method for manufacturing the semiconductor structure as claimed in claim 25, wherein the third gate electrode of the third device is electrically connected to the second source electrode of the second device.

27. The method for manufacturing the semiconductor structure as claimed in claim 25, further comprising:
    forming another isolation structure on the substrate, so that other portions of the epitaxial layer corresponding to the second device and the third device are isolated from each other by said another isolation structure.

28. The method for manufacturing the semiconductor structure as claimed in claim 25, wherein the first device is a high-voltage enhancement mode transistor, and the second device and the third device are high-voltage depletion mode transistors.

\* \* \* \* \*